United States Patent [19]
Mensonides et al.

[11] Patent Number: 5,982,812
[45] Date of Patent: Nov. 9, 1999

[54] METHOD AND APPARATUS FOR MONITORING FREQUENCY SYNTHESIZER LOCKING TIME

[75] Inventors: John W. Mensonides, Monroe; Bruce G. Warren, Poulsbo; Alan F. Jovanovich, Des Moines, all of Wash.

[73] Assignee: Intermec IP Corp., Woodland Hills, Calif.

[21] Appl. No.: 08/856,257

[22] Filed: May 14, 1997

[51] Int. Cl.[6] .............................. H04L 25/64; H04B 1/18; H04B 1/06; H03L 7/00
[52] U.S. Cl. ...................... 375/215; 455/192.1; 455/265; 331/1 R
[58] Field of Search ..................................... 375/215, 294, 375/327, 344, 362, 373, 375, 376; 329/307, 325, 360; 331/1 R, 1 A, 18, 34; 332/127; 342/103; 370/503; 455/260, 180.3, 192.1, 192.2, 255–259, 264, 265, 183.1, 119

[56] References Cited

U.S. PATENT DOCUMENTS 4,409,688  10/1983  Baker .................................... 455/165.1
5,471,661  11/1995  Atkinson .............................. 455/165.1
5,686,864  11/1997  Martin et al. .......................... 331/1 A

*Primary Examiner*—Stephen Chin
*Assistant Examiner*—Albert Park
*Attorney, Agent, or Firm*—O'Melveny & Myers LLP

[57] ABSTRACT

A frequency synthesizer circuit comprises a controller, a synthesizer and a voltage controlled oscillator are used to generate an oscillating signal in response to external commands. The synthesizer provides a lock detect signal to the controller when the synthesizer detects that the oscillating signal has reached a desired frequency following application of a load signal. A first timer, a second timer, and a counter are adapted to receive the load signal and the lock detect signal. The first timer provides a first measurement corresponding to an amount of time between the load signal and a first receipt of the lock detect signal. The second timer provides a second measurement corresponding to an amount of time between the load signal and a final receipt of the lock detect signal. The counter provides a count value corresponding to a total number of times that the lock detect signal is received inclusive of the first receipt and the final receipt of the lock detect signal. A memory device is coupled to each of the first timer, second timer, and counter, which has a data storage portion for storing the first measurement, second measurement and count value.

18 Claims, 2 Drawing Sheets

METHOD AND APPARATUS FOR MONITORING FREQUENCY SYNTHESIZER LOCKING TIME

BACKGROUND OF THE INVENTION

1. Field of the Invention

The present invention relates to radio communication systems, and more particularly, to an RF transceiver having a digital frequency synthesizer in which certain parameters relating to the time for the frequency synthesizer to lock onto a desired frequency are monitored in order to provide a measure of performance of the transceiver.

2. Description of Related Art

Spread spectrum modulation techniques are increasingly desirable for communications, navigation, radar and other applications. In a spread spectrum system, the transmitted signal is spread over a frequency band that is wider than the minimum bandwidth required to transmit the information being sent. As a result of the signal spreading, spread spectrum systems have reduced susceptibility to interference or jamming, and enable high data integrity and security. Moreover, by spreading transmission power across a broad bandwidth, power levels at any given frequency within the bandwidth are significantly reduced, thereby reducing interference to other radio devices. In view of these significant advantages, spread spectrum communication systems are highly desirable for commercial data transmission.

In one type of spread spectrum communication system, a radio frequency (RF) carrier is shifted in discrete increments in a pattern dictated by a predetermined sequence. These spread spectrum systems are known as "frequency hopping" modulation systems, since the transmitter jumps from frequency to frequency in accordance with the predetermined sequence. Another type of spread spectrum communication system utilizes an RF carrier modulated by a digital code sequence having a bit rate, or chipping rate, much higher than the clock rate of the information signal. These spread spectrum systems are known as "direct sequence" modulation systems. The RF carrier may be modulated such that a data stream has one phase when a code sequence represents a data "one" and 180° phase shift when the code sequence represents a data "zero."

In either type of spread spectrum system, a digital frequency synthesizer is typically used within a phase-locked loop circuit to generate the RF carrier. The frequency synthesizer may be controlled by a microprocessor, which provides control signals to determine the frequency on which the frequency synthesizer operates. Frequency hopping systems require frequent changes in frequency, and the microprocessor determines the pattern and timing of the frequency changes. Rapid frequency changes may also be necessary in direct sequence systems as well as in other types of RF transceivers, such as to switch between transmitting and receiving modes. A drawback of such frequency synthesizer circuits is that there is an inherent delay period during which the frequency synthesizer stabilizes, or locks onto, a new frequency. This delay period is referred to as the locking time. The locking time of a frequency synthesizer is an important measure of the performance of a radio system, and certain radio system protocols specify stringent locking time parameters.

Radio system manufacturers typically measure the frequency synthesizer locking time using external equipment coupled to the transceiver while it is disassembled to expose the frequency synthesizer circuitry. After the transceiver has been delivered to a customer, however, it is impractical to perform such measurements without returning the transceiver to the manufacturer. As a result, reductions of the frequency synthesizer performance are often not recognized until the radio system has degraded below acceptable levels. Moreover, the factory tests of the frequency synthesizers do not accurately reflect real operating conditions of the radio system in which system power demands and noise affect the operation of the frequency synthesizer, and thus do not provide a reliable indicator of actual performance.

Accordingly, it would be desirable to provide a radio system which constantly monitors the operation of the frequency synthesizer to detect subtle changes in performance, particularly with respect to the locking time of the frequency synthesizer. It would further be desirable to provide a radio system in which the operating dynamics of the frequency synthesizer can be evaluated under real operating conditions after delivery to a customer.

SUMMARY OF THE INVENTION

In accordance with the teachings of the present invention, a frequency synthesizer circuit for an RF communication system is provided in which the locking time of the frequency synthesizer is constantly monitored to detect changes in operational performance.

A conventional frequency synthesizer circuit comprises a controller responsive to external commands to provide frequency data and a load signal to a synthesizer operatively coupled to the controller. The synthesizer provides a DC signal corresponding to the frequency data in response to the load signal. A voltage controlled oscillator is operatively coupled to the synthesizer, and provides an oscillating signal in response to the DC signal. The oscillating signal provides a local oscillator for the RF communication system, and is also provided as an input to the synthesizer as a feedback signal. The synthesizer provides a lock detect signal to the controller when the synthesizer detects that the oscillating signal has reached a frequency corresponding to the frequency data.

In the invention, a first timer, a second timer, and a counter are adapted to receive the load signal and the lock detect signal. The first timer provides a first measurement corresponding to an amount of time between the load signal and a first receipt of the lock detect signal. The second timer provides a second measurement corresponding to an amount of time between the load signal and a final receipt of the lock detect signal. The counter provides a count value corresponding to a total number of times that the lock detect signal is received inclusive of the first receipt and the final receipt of the lock detect signal. A memory device is coupled to each of the first timer, second timer, and counter, which has a data storage portion for storing the first measurement, second measurement and count value. A history of values of the first measurement, second measurement and count value can be used to show variations in performance of the frequency synthesizer over time.

A more complete understanding of the method and apparatus for monitoring frequency synthesizer lock time will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the need for a radio system which constantly monitors the operation of the frequency synthesizer to detect subtle changes in the locking time. In addition, the present invention provides a radio system in which the operating dynamics of the frequency synthesizer can be evaluated under real operating conditions after delivery to a customer. In the detailed description that follows, like element numerals are used to describe like elements illustrated in one or more of the figures.

Figure 1:
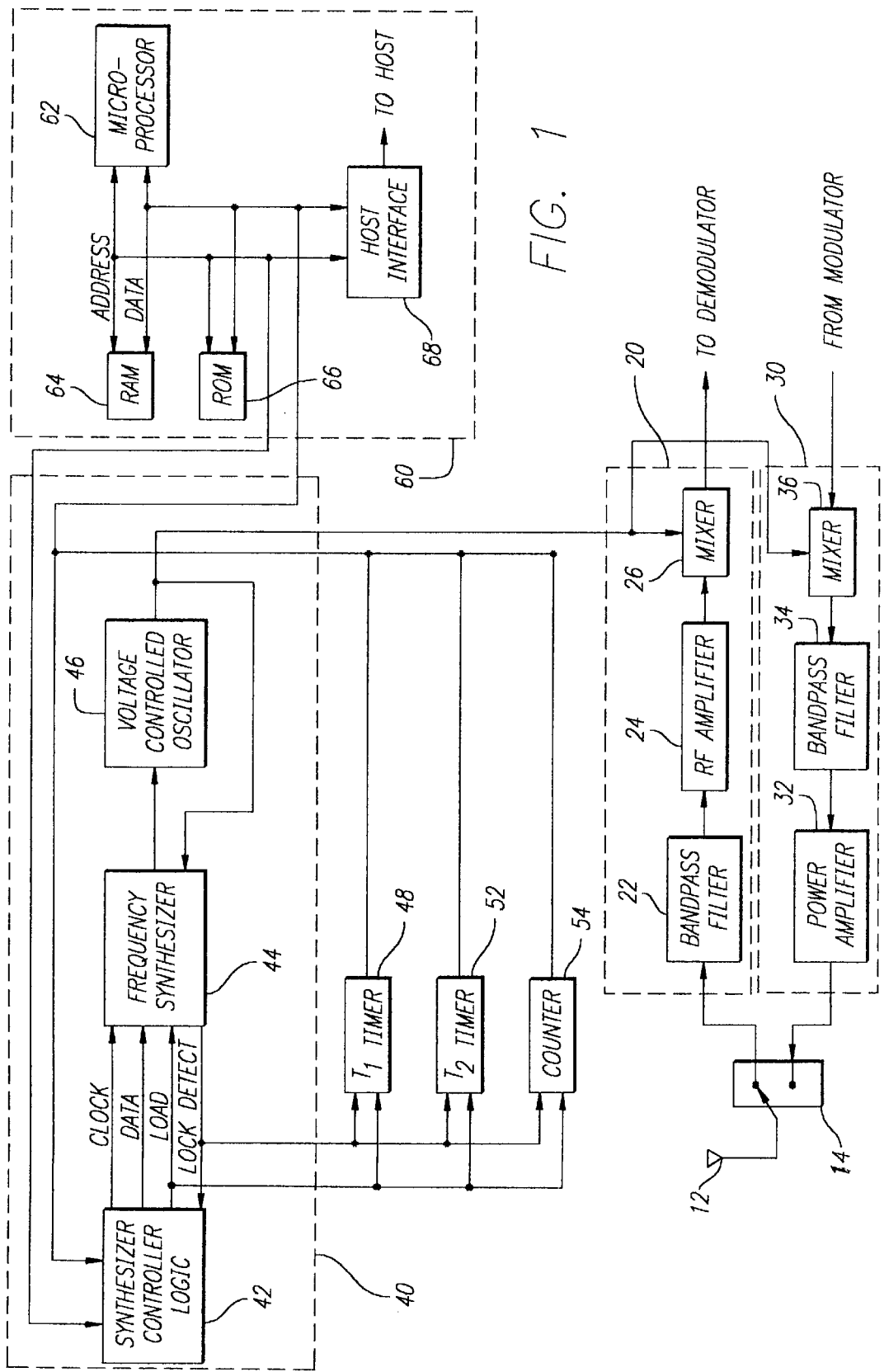
FIG. 1 is a block diagram depicting a radio system having a frequency synthesizer performance monitoring circuit of the present invention.

Referring first to FIG. 1, a block diagram of an RF transceiver adapted to communicate on a plurality of channels is illustrated. The transceiver includes a receiver portion 20 and a transmitter portion 30, and certain additional elements common to both the receiver and transmitter portions, including an antenna 12, a transmit/receive switch 14, a local oscillator section 40, and a processor section 60. The transceiver illustrated in FIG. 1 provides spread spectrum modulation and demodulation of the "frequency hopping" type in which a carrier frequency is shifted in discrete increments in a predetermined pattern. It should be appreciated, however, that the teachings of the present invention are equally applicable to a "direct sequence" type transceiver or any other RF transceiver in which angle modulated communication signals are transmitted on plural channels.

The antenna 12 is provided for receiving and transmitting signals to and from the transceiver. The transmit/receive switch 14 has a common terminal that is electrically coupled to the antenna 12, and two contact positions electrically coupled to the receiver and transmitter portions 20, 30, respectively. The transmit/receive switch 14 enables the antenna 12 to be configured for either transmitting or receiving operations. As known in the art, the transmit/receive switch 14 can be provided by mechanical switch elements, such as a relay, or can comprise solid state switching circuitry. It is preferable that the transmit/receive switch 14 have generally high speed switching characteristics to reduce delays between respective receiving and transmitting operations.

Within the receiver portion 20, a received signal is first provided to a bandpass filter 22 which rejects adjacent extraneous frequencies outside the bandwidth of the received signal. An RF amplifier 24 amplifies the received and filtered signal to a desired amplitude level. A mixer 26 multiplies the amplified signal with a locally generated signal to produce a baseband received signal having a constant difference in frequency between the received signal and the locally generated signal. The locally generated signal comprises a frequency-shifted carrier generated by the local oscillator section 40 (described below). Thereafter, the baseband received signal is provided to downstream demodulation stages that recover the information contained within the originally received signal.

The transmitter portion 30 essentially reverses the process performed by the receiver portion 20. Baseband signals to be transmitted are provided by upstream modulation stages to a mixer 36, along with the frequency-shifted carrier generated by the local oscillator section 40. The mixer 36 produces a modulated carrier signal comprising a multiplication product of the baseband signals with the locally generated frequency-shifted carrier. After the mixer 36, the modulated carrier signal is provided to a bandpass filter 34 to attenuate extraneous frequency components. Thereafter, the modulated carrier signal is provided to a power amplifier 32 that amplifies the signal to a desired output level. Lastly, the amplified signal is provided to the antenna 12 for RF transmission.

The oscillator section 40 comprises a synthesizer controller logic unit 42, a frequency synthesizer 44 and a voltage controlled oscillator 46. The synthesizer controller logic unit 42 communicates with the processor section 60 to control the timing and selection of frequencies for the carrier provided to the receiver and transmitter sections 20, 30. The frequency synthesizer 44 is programmed by a plurality of digital data signals from the synthesizer controller logic unit 42, and provides a D.C. voltage signal that corresponds to a selected frequency. The voltage controlled oscillator 46 receives the D.C. voltage signal, and generates a corresponding oscillating signal at the selected frequency. The oscillating signal is provided to the mixers 26, 36 as the frequency-shifted carrier, and is also provided to the frequency synthesizer 44 as a feedback signal. Such oscillator circuits are well known in the art.

More particularly, the synthesizer controller logic unit 42 communicates three separate signals to the frequency synthesizer 44, including a clock signal, a data signal, and a load signal. The clock signal comprises a fixed-rate system clock used to synchronize communication of digital data signals between the synthesizer controller logic unit 42 and the frequency synthesizer 44. The data signal comprises a digital code or pattern corresponding to a desired carrier frequency of the oscillator section. Each desired carrier frequency has an associated multi-bit digital code, and the individual binary bits of the digital value are transmitted serially into a shift register within the frequency synthesizer 44 in synchronism with the clock signal. The digital code may alternatively be communicated as parallel data. The load signal comprises a single digital pulse that causes the digital code to be loaded from the shift register into a holding register contained within the frequency synthesizer 44. When the D.C. signal provided by the frequency synthesizer 44 reaches a level corresponding to a desired frequency, the frequency synthesizer 44 generates a lock detect signal that is provided back to the synthesizer controller logic unit 42.

Figure 2:
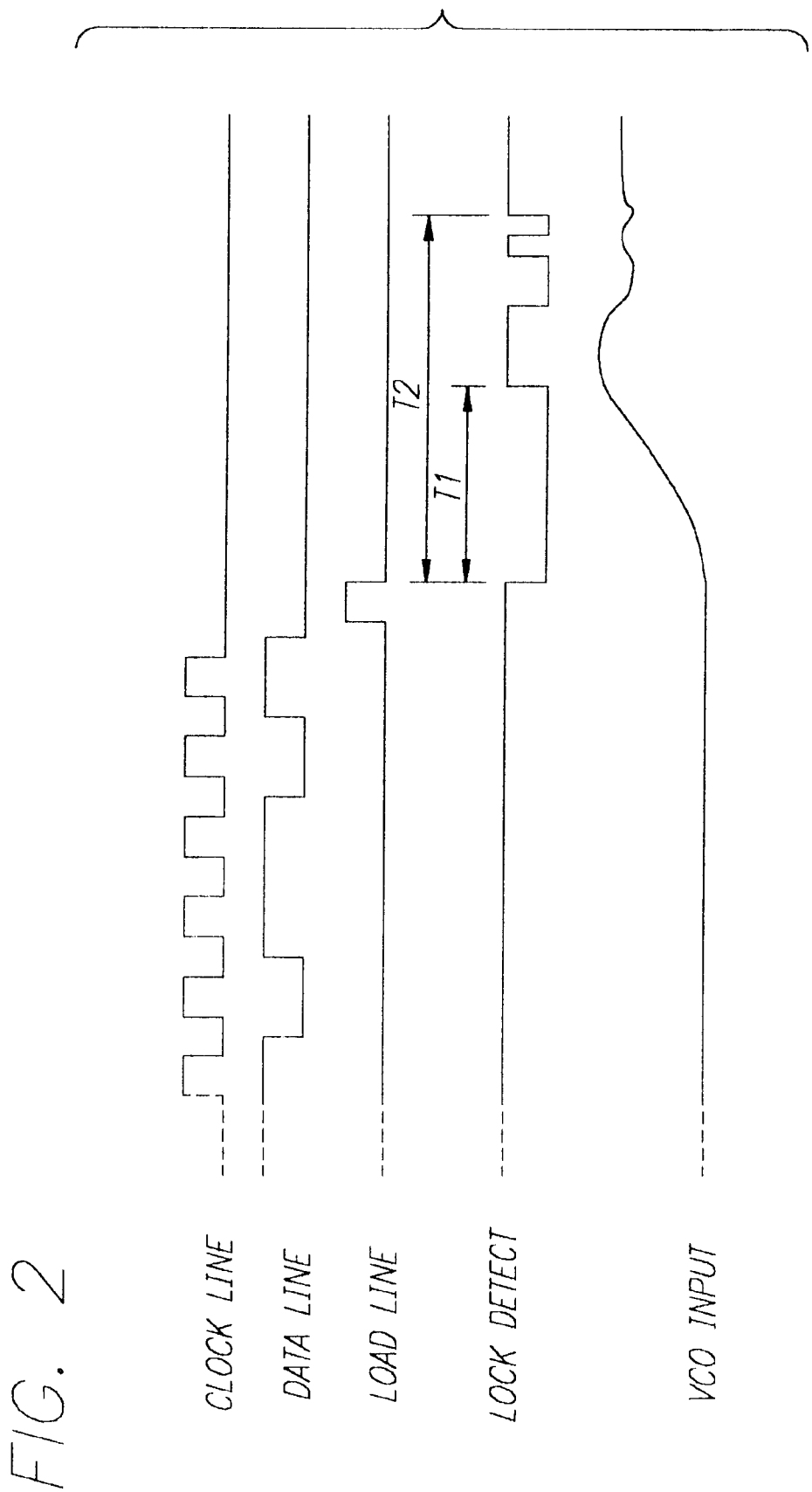
FIG. 2 is a timing diagram illustrating operation of the performance monitoring circuit of FIG. 1.

The clock signal, data signal, load signal and lock detect signal are illustrated in FIG. 2. The digital code is programmed into the frequency synthesizer 44 in synchronism with the clock signal. Following the toggling of the load signal, the D.C. signal provided by the frequency synthesizer 44 as an input to the voltage controlled oscillator 46 rises to a desired level, at which time the lock detect signal changes state from low to high. The D.C. signal will often oscillate around the desired level for several cycles until it stabilizes at the desired level corresponding to the new programmed frequency. This time period between the toggling of the load signal and the stabilization at the programmed frequency is referred to above as the locking time. Accordingly, the lock detect signal will also change state several times with the fluctuations of the D.C. signal before stabilization is reached.

The processor section 60 comprises a microprocessor 62, a random access memory (RAM) 64, a read only memory (ROM) 66, and a host interface unit 68. Multi-bit address and data buses couple the microprocessor 64, RAM 66, ROM 66, an host interface 68 together, as well as to the synthesizer control logic unit 42. The microprocessor 62 controls various functions of the transceiver, such as frequency synthesis, code generation, and transmit/receive switch timing. The RAM 64 provides volatile data storage for data values required by the microprocessor 62 for performance of its various functions. The host interface 68 provides for communication between the transceiver and a host portion that processes and utilizes the information that has been communicated. As known in the art, the microprocessor 62 performs its functions by executing a series of commands or instructions, also referred to as a software program, that may be stored in the ROM 66 or other permanent storage medium, such as a magnetic medium. It should be appreciated that a writable, non-volatile memory storage device, such as a flash memory, may also be used in place of the RAM 64 or ROM 66.

The RAM 64 or ROM 66 may be programmed with a table of data values that correspond to each of the distinct channels or frequencies generated by the oscillator section 40. The microprocessor 62 accesses the table by specifying a particular address on the address bus, and data values are read from the ROM through the data bus. The data values read from the table are provided to the synthesizer controller logic unit 42, which provides a corresponding digital code to the frequency synthesizer 44 as described above.

In order to monitor performance of the frequency synthesizer 44, the transceiver is provided with a first timer circuit 48, a second timer circuit 52, and a counter circuit 54. Each of the first timer circuit 48, second timer circuit 52, and counter circuit 54 have inputs coupled to the load and lock detect signals, and have outputs coupled to the data bus. The first and second timer circuits 48, 52 comprise conventional circuit devices used to measure an amount of time between discrete events, and the counter circuit 54 comprises a conventional circuit device used to count a number of discrete events. As illustrated in FIG. 2, the first timer 48 measures the time duration $T_1$ which extends from the trailing edge of the load signal to the first response of the lock detect signal. The second timer 52 measures the time duration $T_2$ which extends from the trailing edge of the load signal until the final response of the lock detect signal in which it has stabilized at the high state. The counter 54 counts the number of times during which the lock detect signal toggles between high and low states during the time period $T_2$. Following stabilization of the lock detect signal, and before programming of the frequency synthesizer 44, the first timer 48, second timer 52 and counter 54 will be reset to an initial state, such as by control of the synthesizer controller logic unit 42.

These three values are measured each time that a digital code is loaded into the frequency synthesizer 44, and are provided to the processor section 60 for storage in the RAM 64 in relation with the associated frequency information stored in the above-described table. It should be appreciated that over a period of time, a history of data values would be collected showing the performance of the frequency synthesizer 44 at the various frequencies. These data values may be compared to predetermined tolerance values. This collected information may also be downloaded during periodic maintenance checks of the transceiver, or alternatively, may be used to trigger other internal software processes to alert an operator that the frequency synthesizer 44 is operating out of desired tolerance.

Having thus described a preferred embodiment of a method and apparatus for monitoring frequency synthesizer lock time, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. A frequency synthesizer circuit for an RF communication system comprises:

a controller providing frequency data and a load signal;

a synthesizer operatively coupled to said controller to receive said frequency data and said load signal, said synthesizer providing a DC signal corresponding to said frequency data in response to said load signal;

a voltage controlled oscillator operatively coupled to said synthesizer, said voltage controlled oscillator providing an oscillating signal in response to said DC signal, said oscillating signal also being provided to said synthesizer as a feedback signal, said synthesizer providing a lock detect signal to said controller upon said synthesizer detecting that said oscillating signal has reached a frequency corresponding to said frequency data;

at least one of a first timer, a second timer and a counter each being adapted to receive said load signal and said lock detect signal, said first timer providing a first measurement corresponding to an amount of time between said load signal and a first detection of said lock detect signal, said second timer providing a second measurement corresponding to an amount of time between said load signal and a stabilization of said lock detect signal, and said counter providing a count value corresponding to a total number of times that said lock detect signal changes state between said first detection and said stabilization of said lock detect signal.

2. The frequency synthesizer circuit of claim 1, further comprising a memory device coupled to said at least one of said first timer, said second timer, and said counter, said memory device having a data storage portion for storing corresponding ones of said first measurement, said second measurement and said count value.

3. The frequency synthesizer circuit of claim 2, further comprising a data bus coupled to said memory device, said controller and said at least one of said first timer, said second timer and said counter.

4. The frequency synthesizer circuit of claim 1, wherein said controller further provides a clock signal to said frequency synthesizer, said frequency data being provided to said frequency synthesizer serially in synchronism with said clock signal.

5. The frequency synthesizer circuit of claim 1, wherein said controller is responsive to external commands to provide said frequency data and said load signal.

6. A frequency synthesizer circuit for an RF communication system comprises:

a controller providing frequency data and a load signal;

a synthesizer operatively coupled to said controller to receive said frequency data and said load signal, said synthesizer providing a DC signal corresponding to said frequency data in response to said load signal;

a voltage controlled oscillator operatively coupled to said synthesizer, said voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data; and means for monitoring at least one characteristic of said frequency synthesizer circuit corresponding to an amount of time for the oscillating signal to stabilize at said frequency corresponding to said frequency data, said at least one characteristic providing an historical record of changes in actual performance of said frequency synthesizer circuit.

7. A frequency synthesizer circuit for an RF communication system comprises:

a controller providing frequency data and a load signal;

a synthesizer operatively coupled to said controller to receive said frequency data and said load signal, said synthesizer providing a DC signal corresponding to said frequency data in response to said load signal;

a voltage controlled oscillator operatively coupled to said synthesizer, said voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data; and means for monitoring at least one characteristic of said frequency synthesizer circuit pertaining to an amount of time for the oscillating signal to stabilize at said frequency corresponding to said frequency data wherein said monitoring means further comprises a first timer adapted to receive said load signal and said lock detect signal, said first timer providing a first characteristic corresponding to an amount of time between said load signal and a first detection of said lock detect signal.

8. The frequency synthesizer circuit of claim 7, wherein said monitoring means further comprises a second timer adapted to receive said load signal and said lock detect signal, said second timer providing a second characteristic corresponding to an amount of time between said load signal and a stabilization of said lock detect signal.

9. A frequency synthesizer circuit for an RF communication system comprises:

a controller providing frequency data and a load signal;

a synthesizer operatively coupled to said controller to receive said frequency data and said load signal, said synthesizer providing a DC signal corresponding to said frequency data in response to said load signal;

a voltage controlled oscillator operatively coupled to said synthesizer, said voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data; and means for monitoring at least one characteristic of said frequency synthesizer circuit pertaining to an amount of time for the oscillating signal to stabilize at said frequency corresponding to said frequency data, wherein said monitoring means further comprises a counter adapted to receive said load signal and said lock detect signal, said counter providing a count value corresponding to a total number of times that said lock detect signal changes state between a first detection of said lock detect signal and a stabilization of said lock detect signal.

10. The frequency synthesizer circuit of claim 6, further comprising a memory device coupled to said monitoring means, said memory device having a data storage portion for storing said at least one characteristic.

11. The frequency synthesizer circuit of claim 10, further comprising a common data bus coupled to said memory device, said controller and said monitoring means.

12. The frequency synthesizer circuit of claim 6, wherein said controller further provides a clock signal to said frequency synthesizer, said frequency data being provided to said frequency synthesizer serially in synchronism with said clock signal.

13. In a frequency synthesizer circuit comprising a controller providing frequency data and a load signal, a synthesizer providing a DC signal corresponding to said frequency data in response to said load signal, a voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data, wherein a method for monitoring performance of the frequency synthesizer comprises:

monitoring at least one performance characteristic of said frequency synthesizer corresponding to an amount of time for the oscillating signal to stabilize at said frequency corresponding to said frequency data, said at least one performance characteristic providing an historical record of changes in performance of said frequency synthesizer circuit.

14. In a frequency synthesizer circuit comprising a controller providing frequency data and a load signal, a synthesizer providing a DC signal corresponding to said frequency data in response to said load signal, a voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data, wherein a method for monitoring performance of the frequency synthesizer comprises:

monitoring at least one performance characteristic of said frequency synthesizer corresponding to an amount of time for the oscillating signal to stabilize at said frequency corresponding to said frequency data, wherein said monitoring step further comprises monitoring an amount of time between said load signal and a first detection of said lock detect signal.

15. The method of claim 13, wherein said monitoring step further comprises monitoring an amount of time between said load signal and stabilization of said lock detect signal.

16. In a frequency synthesizer circuit comprising a controller providing frequency data and a load signal, a synthesizer providing a DC signal corresponding to said frequency data in response to said load signal, a voltage controlled oscillator providing an oscillating signal in response to said DC signal, said oscillating signal being provided to said synthesizer as a feedback signal, said synthesizer providing a lock detect signal to said controller upon said synthesizer detecting that said oscillating signal has reached a frequency corresponding to said frequency data, wherein a method for monitoring performance of the frequency synthesizer comprises:

monitoring at least one performance characteristic of said frequency synthesizer corresponding to an amount of time for the oscillating signal to stabilize at said frequency corresponding to said frequency data, wherein said monitoring step further comprises counting a total number of times that said lock detect signal changes state between a first detection of said lock detect signal and a stabilization of said lock detect signal.

17. The method of claim 13, further comprising storing said at least one performance characteristic.

18. The frequency synthesizer circuit of claim 6, wherein said at least one characteristic includes at least one of a first measurement of time between said load signal and a first detection of said lock detect signal, a second measurement of time between said load signal and a final detection of said lock detect signal, and a number of times that said lock detect signal changes state between said first detection of said lock detect signal and said final detection of said lock detect signal.

* * * * *